(12) United States Patent
Fjelstad

(10) Patent No.: US 7,948,093 B2
(45) Date of Patent: May 24, 2011

(54) MEMORY IC PACKAGE ASSEMBLY HAVING STAIR STEP METAL LAYER AND APERTURES

(75) Inventor: Joseph C. Fjelstad, Maple Valley, WA (US)

(73) Assignee: Samgsung Electronics Co., Ltd., Gyeonggi-do (KR)

( * ) Notice: Subject to any disclaimer, the term of this patent is extended or adjusted under 35 U.S.C. 154(b) by 623 days.

(21) Appl. No.: 11/965,705

(22) Filed: Dec. 27, 2007

(65) Prior Publication Data

US 2008/0211071 A1   Sep. 4, 2008

Related U.S. Application Data

(60) Provisional application No. 60/877,691, filed on Dec. 28, 2006, provisional application No. 60/920,845, filed on Mar. 30, 2007.

(51) Int. Cl.
*H01L 23/48* (2006.01)
*H01L 23/52* (2006.01)

(52) U.S. Cl. ............... 257/784; 257/780; 257/E23.024

(58) Field of Classification Search ............... 257/784, 257/780, E23.024
See application file for complete search history.

(56) References Cited

U.S. PATENT DOCUMENTS

| | | | | |
|---|---|---|---|---|
| 5,583,378 A | * | 12/1996 | Marrs et al. | 257/710 |
| 5,844,168 A | * | 12/1998 | Schueller et al. | 174/558 |
| 6,218,731 B1 | * | 4/2001 | Huang et al. | 257/738 |
| 6,373,131 B1 | * | 4/2002 | Karnezos | 257/712 |
| 6,396,141 B2 | * | 5/2002 | Schueller et al. | 257/706 |
| 6,489,667 B1 | * | 12/2002 | Shim et al. | 257/668 |
| 7,592,709 B2 | * | 9/2009 | Chung et al. | 257/784 |
| 2001/0002321 A1 | * | 5/2001 | Castro | 438/122 |
| 2002/0109226 A1 | * | 8/2002 | Khan et al. | 257/737 |
| 2003/0222344 A1 | * | 12/2003 | Hosoyamada et al. | 257/738 |
| 2003/0230799 A1 | * | 12/2003 | Yee et al. | 257/706 |
| 2004/0004277 A1 | * | 1/2004 | Tsai et al. | 257/678 |
| 2005/0104209 A1 | * | 5/2005 | Kang | 257/737 |

* cited by examiner

*Primary Examiner* — Nitin Parekh
(74) *Attorney, Agent, or Firm* — Myers Bigel Sibley & Sajovec, P.A.

(57) ABSTRACT

Disclosed is a low cost memory IC package assembly having a first metal layer bonded to the die and a dielectric insulating layer with circuits and with apertures to expose the first metal layer bonded thereto.

20 Claims, 6 Drawing Sheets

MEMORY IC PACKAGE ASSEMBLY HAVING STAIR STEP METAL LAYER AND APERTURES

CROSS-REFERENCE TO RELATED APPLICATIONS

This filing incorporates by reference U.S. patent application Ser. No. 10/987,187 by Joseph C. Fjelstad, et al., filed Nov. 12, 2004, and entitled "Tapered Dielectric and Conductor Structures and Applications Thereof," and U.S. Provisional Application 60/519,945 filed Nov. 12, 2003 and entitled "Memory Package and Structures Created Therefrom." This filing also incorporates by reference U.S. Provisional Application 60/676,863 by Joseph C. Fjelstad, filed May 2, 2005, and entitled "Memory Packages Having Stair Step Interconnection Layers," and U.S. application Ser. No. 10/947,686 filed Sep. 9, 2004 by Joseph C. Fjelstad, and entitled "Multi-Surface IC Packaging Structures and Methods for Their Manufacture," and U.S. application Ser. No. 10/964,578 Filed Oct. 12, 2004 by Joseph C. Fjelstad, et al., and entitled "Multi-Surface Contact IC Packaging Structures and Assemblies." This application claims priority from, and incorporates by reference in their entirety, U.S. Provisional Application 60/877,691 by Joseph C. Fjelstad, filed Dec. 28, 2006 and entitled "Memory IC Package Assembly Having Stair Step Metal Layer and Apertures", and U.S. Provisional Application No. 60/920,845 Joseph C. Fjelstad filed Mar. 30, 2007 and entitled "Memory IC Package Assembly Having Stair Step Metal Layer and Apertures."

FIELD OF THE INVENTION

The present invention relates to the field of high speed electronic interconnections for memory and the packaging of semiconductor integrated circuits for use therewith.

BACKGROUND

Memory integrated circuits "ICs" for use with most computers operate at speeds slower than current generation central processing unit "CPU" ICs creating a condition generally referred to as the "memory bottleneck". In such condition, the CPU must remain in a wait state until the memory data is written or retrieved. The problem has been addressed, in part, by improved memory system designs. However as electronic systems move into the multi-gigabit per second data rate range, a significant gap remains between top-end operating rates of CPU ICs and memory ICs. Part of this ongoing disparity is due to the limits of current interconnection design, which often results, particularly at higher frequencies, in disturbances that contribute to signal distortion. For example, signal distortion can often be due, at least in part to so-called parasitic effects resulting from traditional interconnect designs. Because signal speed and signal integrity are two primary goals in digital signal transmission, interconnect designs that assure signal integrity during data transmission are key. Controlling signal integrity begins with the design of the circuit. Choices made in terms of circuit layout, and the materials used and the general architecture of the complete assembly, will all have impact of the quality if the signal transmission and its ultimate integrity.

Parasitic effects and signal discontinuity are primary sources of signal disturbance, thus one of the major objectives in maintaining signal integrity is to eliminate or minimize the parasitic effects and electrical discontinuities impinging upon a signal. Parasitic effects and electrical discontinuities are caused by a number of factors such as sharp changes in direction, changes in material, circuit feature flaws and even interconnections, such as solder balls used to connect IC packages to next level interconnection substrates. All these can affect signal integrity by introducing undesirable changes in impedance and creating signal reflections. There is also concern about signal skew, cause by differing signal lengths, which is important in assuring proper signal timing. Finally, cross talk between signals due to inductance is another deleterious effect associated with current packaging structures for memory ICs.

The first place in an electronic system such parasitic effects are encountered, beyond those encountered within the IC structure itself, is the IC package which is used to connect the IC die to a next level interconnection system. While current generation IC packages are presently reasonably well suited to meeting current needs, as the electronics industry moving to ever higher data signaling rates, the formerly minor concerns associated with packages and interconnection paths have now reached a level of critical importance.

The net effect of this complex web of interactive elements is that they collectively combine to make it extremely difficult to predict and design for reliable high performance at higher processing speeds. Additionally, at higher processing speeds, parasitic effects and signal discontinuities and reflections can contribute to the thermal demands placed on a system. Thus, as memory circuit speeds climb, there is need for new approaches to the design of memory package interconnections to overcome the looming and highly complex electrical and thermal problems associated with traditional approaches to IC memory packaging and to create structures which require lower power to operate. Moreover there is need to identify and deploy IC packages for memory devices which are high yielding in manufacture and assembly and which are inexpensive to build and use.

BRIEF DESCRIPTION OF THE DRAWINGS

The present invention is best illustrated by way of example, and not by way of limitation, in the figures of the accompanying drawings and in which like reference numerals refer to similar elements and in which.

DETAILED DESCRIPTION

Disclosed herein using descriptions and figures are IC package structures having stair step connections for use with memory devices and which improve control of the quality of an electronic signal that passes though a memory chip package and between memory chips, provide improved thermal management, and lower power consumption than current package designs and structures.

The embodiments disclosed herein address many of the limitations common to many of the current design and manufacturing practices employed in the fabrication of electronic memory device (e.g. IC or integrated circuit) and system interconnections. Some of those limitations include and inability of current design and manufacturing practices to address fully and adequately the needs for improved electronic signal integrity as the electronic signal transitions between memory chips on an electronic memory module.

An objective of the present disclosure to describe memory package structures which inexpensively provide direct and uniform controlled impedance across the surface of a memory package by routing high speed signals on a first circuit layer which references directly a metal ground layer proximate to the first circuit layer, wherein the final assembly offers improved signal quality and at lower power consumption.

Another objective is to describe a memory IC package structure having two metal layers but which does not require or use plated through holes to access the second metal layer (i.e., ground layer).

It is another objective of the present disclosure to describe a memory IC package structure having a compliant stress buffer adhesive layer to improve assembled reliability.

It is yet another objective of the present disclosure to describe a memory IC package structure which improves and makes more uniform heat removal using the ground metal layer.

Figure 1A:
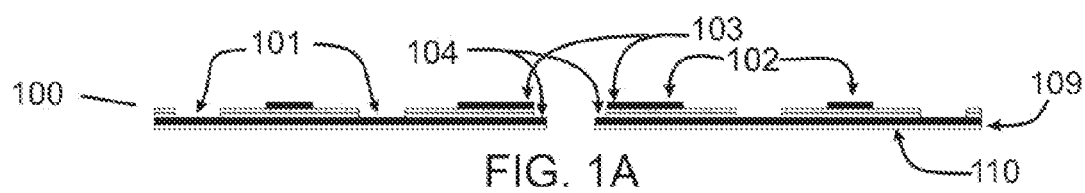
FIG. 1A shows a cross section of an embodiment of a memory package structure.

The present embodiments offer novel alternative approaches to addressing and meeting the stated objectives thus solving certain problems associated with current design approaches. Throughout this disclosure, many specific details are recited which are not essential to make or use the embodiments described herein. Accordingly, these details are offered for purposes of clarity and enablement, and are not intended to limit the spirit and scope of the embodiments described herein, which includes variations and equivalent structures and processes. For example, the IC die (IC chip) is shown in the attached drawings as having one central row of bond pads. However, the depiction of this detail is not intended to limit the scope or application of IC chips described herein. Alternative embodiments such as those comprising additional rows of bond pads or bond pads along one or more edge of the die if they are so provided are fully intended as falling within the scope of the embodiments described herein. The advantages are best illustrated with figures as show herewith, wherein:

FIG. 1A depicts in cross section an embodiment of a memory IC package substrate assembly 100 having apertures 101 which expose directly a metal ground layer to serve as contact point for next level assembly. The substrate also has conductor contact points 102 to be used for next level assembly. Other contact points are provided for interconnection to the IC memory die. Contact points 103 are for electrical connection to circuit elements and contacts 104 are for electrical connection to the ground layer. An insulator would normally cover the non-contact portions of the metal circuits, however the structure is shown without a insulator covering the circuits for brevity.

Figure 1B:
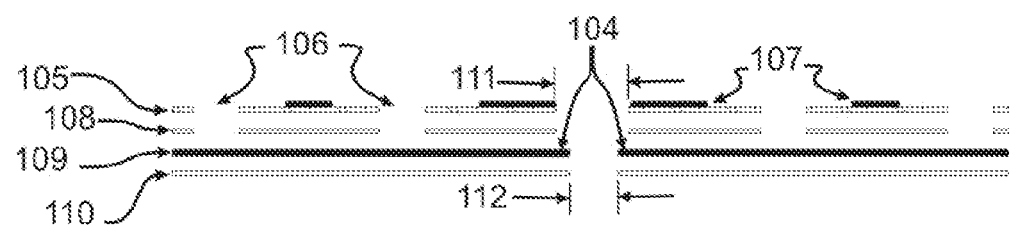
FIG. 1B shows exploded view of the main elements of FIG. 1A.
Figure 8:
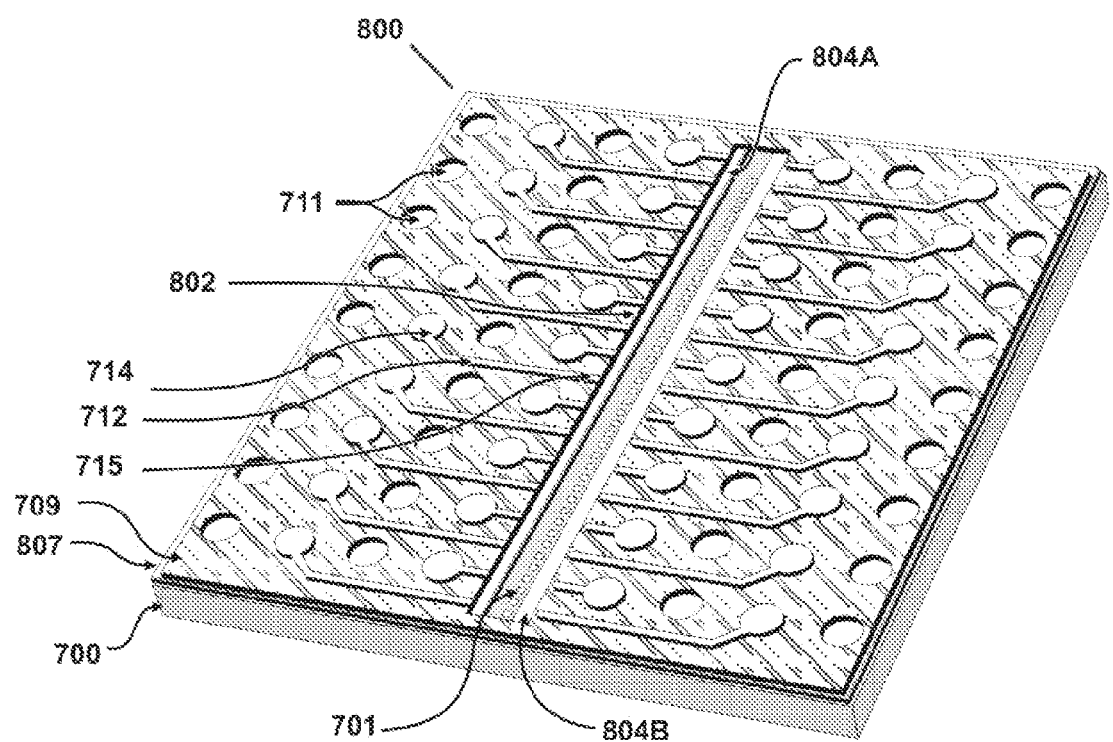
FIG. 8 shows a perspective view of a partially assembled embodiment of an IC memory package comprised of the elements of FIG. 7 stacked and joined to a memory IC die.

FIG. 1B depicts in cross section the elements of the embodiment shown in FIG. 1A where 105 is a dielectric insulation material layer of a suitable material (e.g. polyimide film). The dielectric insulation material layer has apertures 106 to allow access to ground layer 109 when sandwiched and has circuits 107 with electrical terminations at both ends for electrical connection as shown in FIG. 1A. A suitable adhesive 108 is used to bond the dielectric insulation material 105 with circuits 107 to the ground metal 109. A first aperture 111 extends through the dielectric layer 105 and the adhesive layer 108. A second aperture 112 extends through the ground layer 109 and suitable adhesive 110 to allow access to the bond pads on the memory IC die. Aperture 111 is aligned with, but slightly wider than aperture 112, forming opposing shelves 104 (see FIG. 1A), the upper surface of the shelves comprising narrow strips of the ground layer 109 that can be accessed through the first aperture 111. Referring also to FIG. 8 momentarily, the alignment of apertures 111 and 112 is configured to provide access to the bond pads 701 on the memory IC die 700 during assembly of the memory IC package. The suitable adhesive 110 serves to bond the assembly to the die and has suitable insulation characteristics.

According to an embodiment, one or more of the dielectric insulation layer 105, the adhesive layer 108, and the adhesive layer 110 may further function as a stress buffer layers that is particularly suited for ameliorating physical stresses that mechanically impinge on the memory IC package from "next-level" components and connections.

Figure 2A:
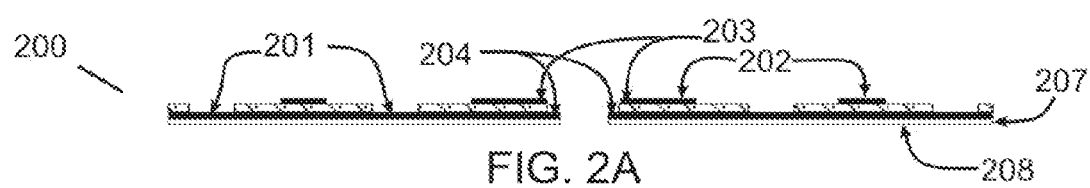
FIG. 2A shows a cross section of another embodiment of a memory package structure.

FIG. 2A depicts in cross section an embodiment of a memory IC package substrate assembly 200 having apertures 201 which expose directly a metal ground layer 207 to serve as contact point for next level assembly. The substrate also has conductor contact points 202 to be used for next level assembly. Other contact points are provided for interconnection to the IC memory die. Contact points 203 are for electrical connection to circuit elements and contacts 204 are for electrical connection to the ground layer. An insulator would normally cover the non-contact portions of the metal circuits, however the structure is shown without a insulator covering the circuits for brevity.

Figure 2B:
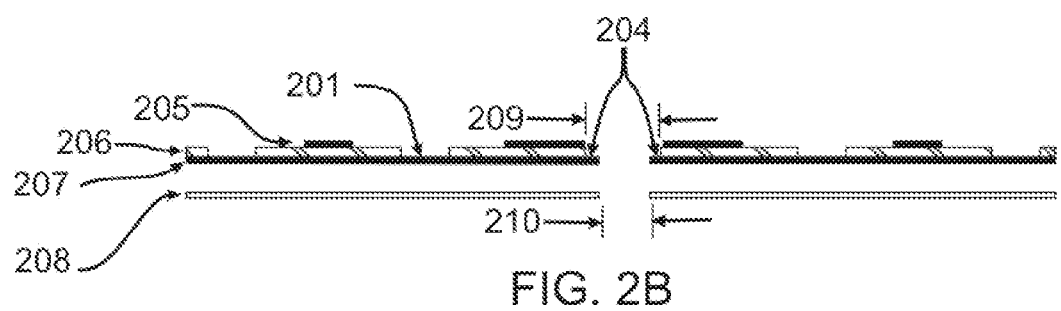
FIG. 2B shows exploded view of the main elements of FIG. 2A.

FIG. 2B depicts in cross section the elements of the embodiment shown in FIG. 2A where 206 is a dielectric insulation material layer of a suitable material (e.g. polyimide film). The dielectric insulation material layer has apertures 201 to allow access to ground layer 207 which is bonding to one side (e.g. bottom) of the dielectric insulation material 206. Circuits 205 are disposed on the second side (e.g., top surface) of dielectric layer 606. The circuits 205 have electrical terminations at both ends for electrical connection as shown in FIG. 2A. A suitable adhesive 208 is used to bond the dielectric insulation material 206 with circuits 205 and ground metal 207 to a memory IC die, such as depicted in FIGS. 4-8.

A first aperture 209 extends through the dielectric layer 206. A second aperture 210 extends through the ground layer 207 and through the suitable adhesive 208. Aperture 209 is aligned with, but slightly wider than aperture 210, thereby forming opposing shelves 204 (FIG. 2A), exposing a portion of the ground layer 207 along parallel strips on opposing sides of the aperture. Briefly referring also to FIG. 8, the alignment of apertures 209 and 210 is further configured to allow access to the bond pads 701 on the memory IC die 700 during assembly of the memory IC package. The suitable adhesive 208 serves to bond the assembly to the die and also, advantageously has suitable insulation characteristics.

According to an embodiment, one or more of the dielectric insulation layer 206, and the adhesive 208 may further function as stress buffer layers that are particularly suited for ameliorating physical stresses that mechanically impinge on the memory IC package from "next-level" components and connections.

Figure 3A:
FIG. 3A shows a cross section of another embodiment of a memory package structure.

FIG. 3A depicts in cross section an embodiment of a memory IC package substrate assembly 300 having conductive projections 301 which are electrically connected to the ground 307 and which protrude above the surface of the assembly to serve as contact points for the ground for next level assembly. The substrate also has circuit conductor contact points 304 to be used for next level assembly. Other contact points (302,303) are provided for interconnection to the IC memory die. Contact points 303 are for electrical connection between select terminals of the memory die (FIGS. 4-8) and corresponding circuit elements 304, and between select terminals of the memory die and contacts 302, for electrical connection to the ground layer. An insulator would normally cover the non-contact portions of the conductor circuits, however the structure is shown without a insulator covering the circuits for brevity.

Figure 3B:
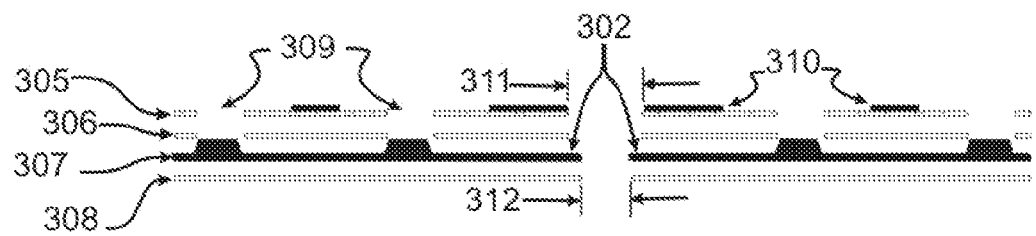
FIG. 3B shows exploded view of the main elements of FIG. 3A.

FIG. 3B depicts in cross section the elements of the embodiment shown in FIG. 3A where 305 is a dielectric insulation material layer of a suitable material (e.g. polyimide film) having circuits 310 provided on one side (e.g., top). The circuits have electrical terminations at both ends for electrical connection as shown in FIG. 3A. The dielectric insulation material layer has apertures 309 to allow access to ground layer 307 which is illustrated as having projections (e.g. bumps) disposed to pass through the apertures 309 in dielectric insulation layer 305. A layer comprised of a suitable adhesive 306 has apertures which correspond to those of dielectric insulation layer 305 is disposed between the insulation layer 305 and the ground metal layer 307. A suitable adhesive 308 is used to bond one side (e.g. bottom) of the ground metal 307 surface to a memory IC die. A first aperture 311 within the upper layers of FIG. 3B extends through the dielectric layer 305 and the adhesive layer 306. A second aperture 312 extends through the ground layer 307 and through the suitable adhesive layer 308. Aperture 311 is aligned with, but slightly wider than aperture 312, thereby forming opposing shelves 303 (FIG. 3A), exposing a portion of the ground layer 307 along parallel strips on opposing sides of the aperture. Briefly referring also to FIG. 8, the alignment of apertures 311 and 312 is further configured to allow access to the select bond pads 701 on the memory IC die 700 during assembly of the memory IC package. The suitable adhesive 308 serves to bond the assembly to the die and advantageously includes suitable insulation characteristics. The structure shown may be produced by having the ground layer projections pierce the dielectric insulation layer at desired locations in a lamination step in an alternative embodiment.

According to an embodiment, one or more of the dielectric insulation layer 305, the adhesive layer 306, and the adhesive layer 308 may further function as a stress buffer layers that are particularly suited for ameliorating physical stresses mechanically impinging on the memory IC package from "next-level" components and connections.

Figure 4:
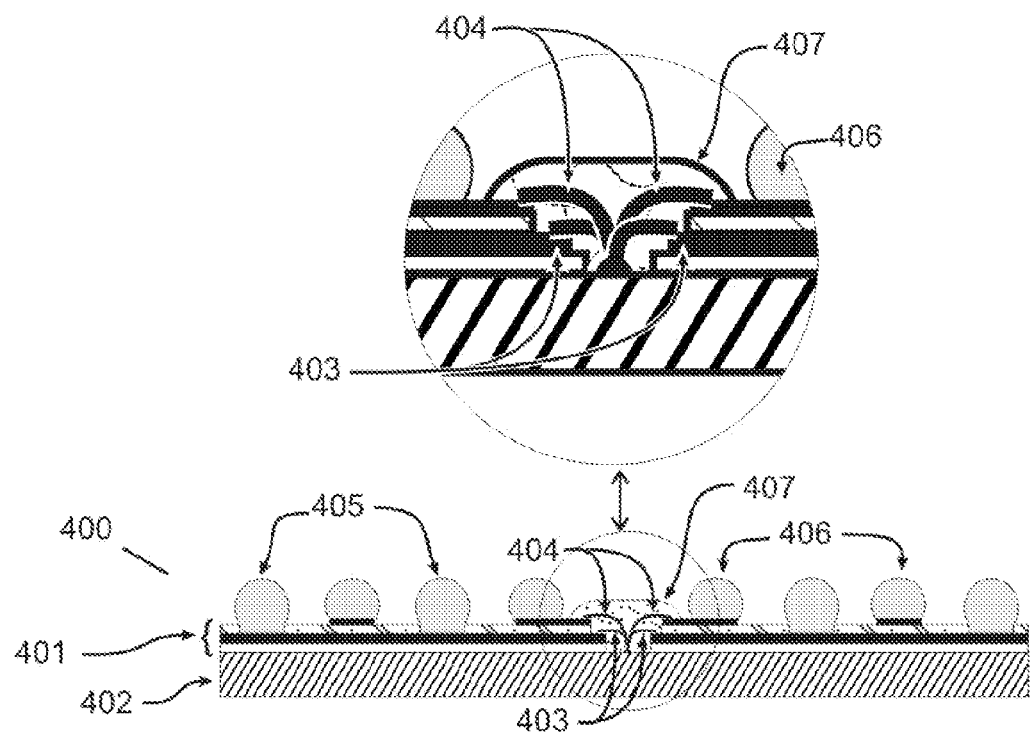
FIG. 4 shows a cross section of a memory IC package assembly embodiment showing its structure.

FIG. 4 shows in cross section of a completed IC package assembly embodiment 400. The memory package includes an IC package substrate 401, such as one of the embodiments illustrated in FIGS. 1-3 in exploded form and FIGS. 4-6 in assembled form. As illustrated in FIGS. 1-3, the substrate is advantageously comprised of insulation with apertures, circuit layer, ground layer and suitable adhesive. The adhesive layer (e.g. 110, 208, 308) is bonded to a memory IC die 402. First wire bond interconnections 403 extend from die terminals to the ground layer. Second wire bond connections 404 extend from select terminals of the IC die to corresponding terminals of the circuit layer. The wire bond interconnections, as well as the terminal points to which they are connected, are protected by an encapsulant 407. A first plurality of solder balls 405 make connection to the ground layer and a second plurality of solder balls 406 make connection to circuits. While not shown, an insulating dielectric material is customary and is used to cover exposed circuit areas not used for making connections to the IC die or a next level interconnection assembly (e.g. PCB or electronic module). The finished assembly is generically referred to as an area array package and more specifically as a BGA package.

Figure 5:
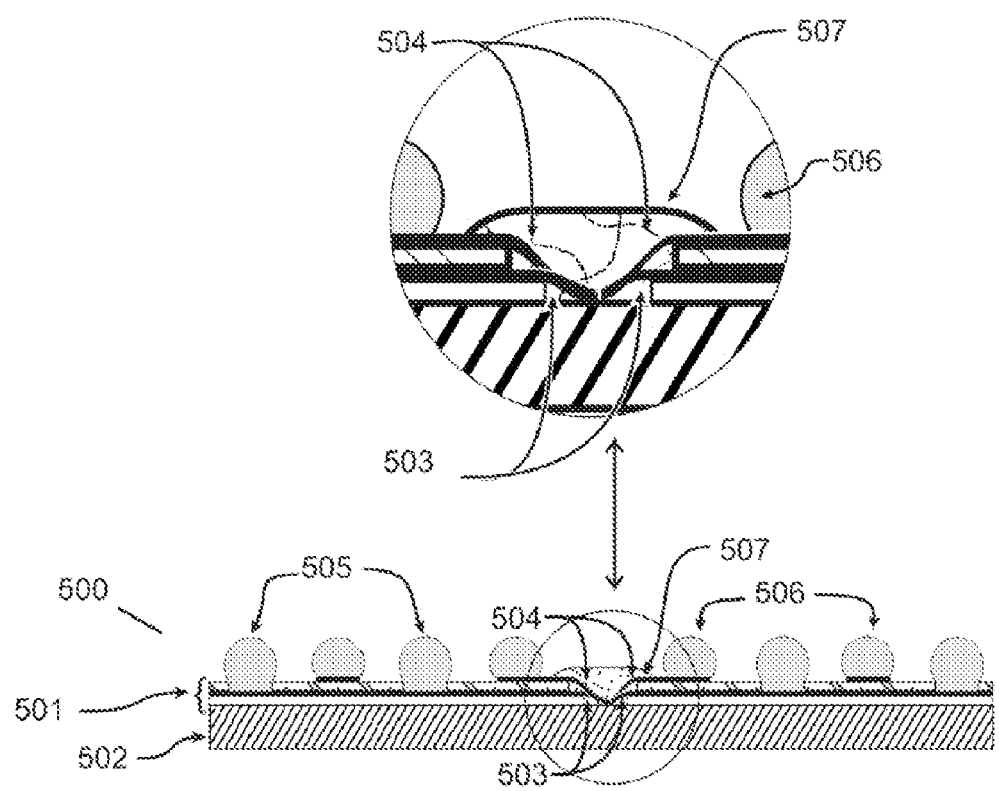
FIG. 5 shows a cross section of another memory IC package assembly embodiment showing its structure.

FIG. 5 shows in cross section another completed IC package assembly embodiment 500. The IC package assembly includes an IC package substrate 401 comprised of insulation with apertures, circuit layer, ground layer and suitable adhesive (i.e., supplying good mechanical joining along with stress buffer capability) such as illustrated in FIGS. 1-3 is bonded to a memory IC die 502. First integral metal bond interconnections 503 form electrical path(s) between select terminals on the die and the ground layer. Second integral metal circuit connections 504 form electrical path(s) between select terminals of the IC die and select terminals of the circuit layer. These circuit paths, and the terminals to which they connect, are collectively protected by an encapsulant 507. A first plurality of solder balls 505 make connection to the ground layer and a second plurality of solder balls 506 make connection to circuits. Again, while not shown, an insulating dielectric material is normally applied to cover expose circuit areas not used for making connections to the IC die or a next level assembly (e.g. PCB or electronic module). The finished assembly is generically referred to as an area array package and more specifically as a BGA (ball grid array) package.

Figure 6:
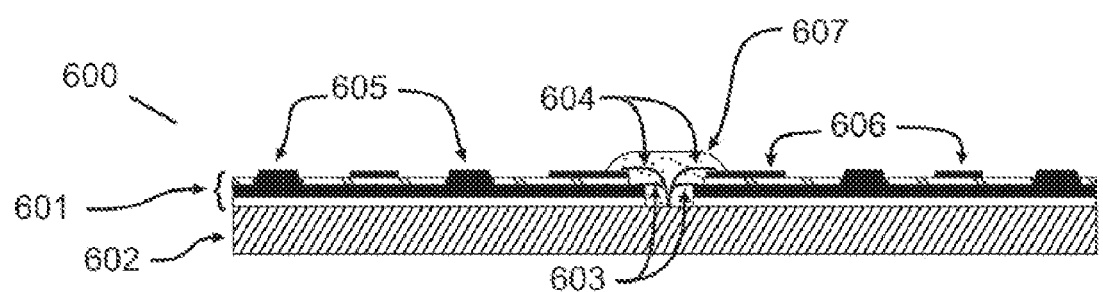
FIG. 6 shows a cross section of another memory IC package assembly embodiment showing its structure.

FIG. 6 shows in cross section of a completed IC package assembly embodiment 600. The completed IC package assembly includes an IC package substrate 601 comprised of insulation with apertures, circuit layer, ground layer having conductive projections 605 and suitable adhesive is bonded to a memory IC die 602. First wire bond interconnections 603 form electrical paths between select terminals on the die, and the ground layer. Second wire bond connections 604 form electrical paths between select terminals of the IC die and corresponding terminals of the circuit layer. These bond wire connections (not shown), and the terminals to which they are connected, are protected by an encapsulant 607. A first plurality of contacts in the form of metal projections 405 serve to make connection to the ground layer and a second plurality of contacts serve to make connection to circuits. Once again, while not shown in the figure, an insulating dielectric material would normally be used to cover expose circuit areas not used for making connections to the IC die or a next level assembly (e.g. PCB or electronic module). The finished assembly is generically referred to as an area array package and more specifically as a LGA (land grid array) package wherein the contacts are substantially planar.

Figure 7:
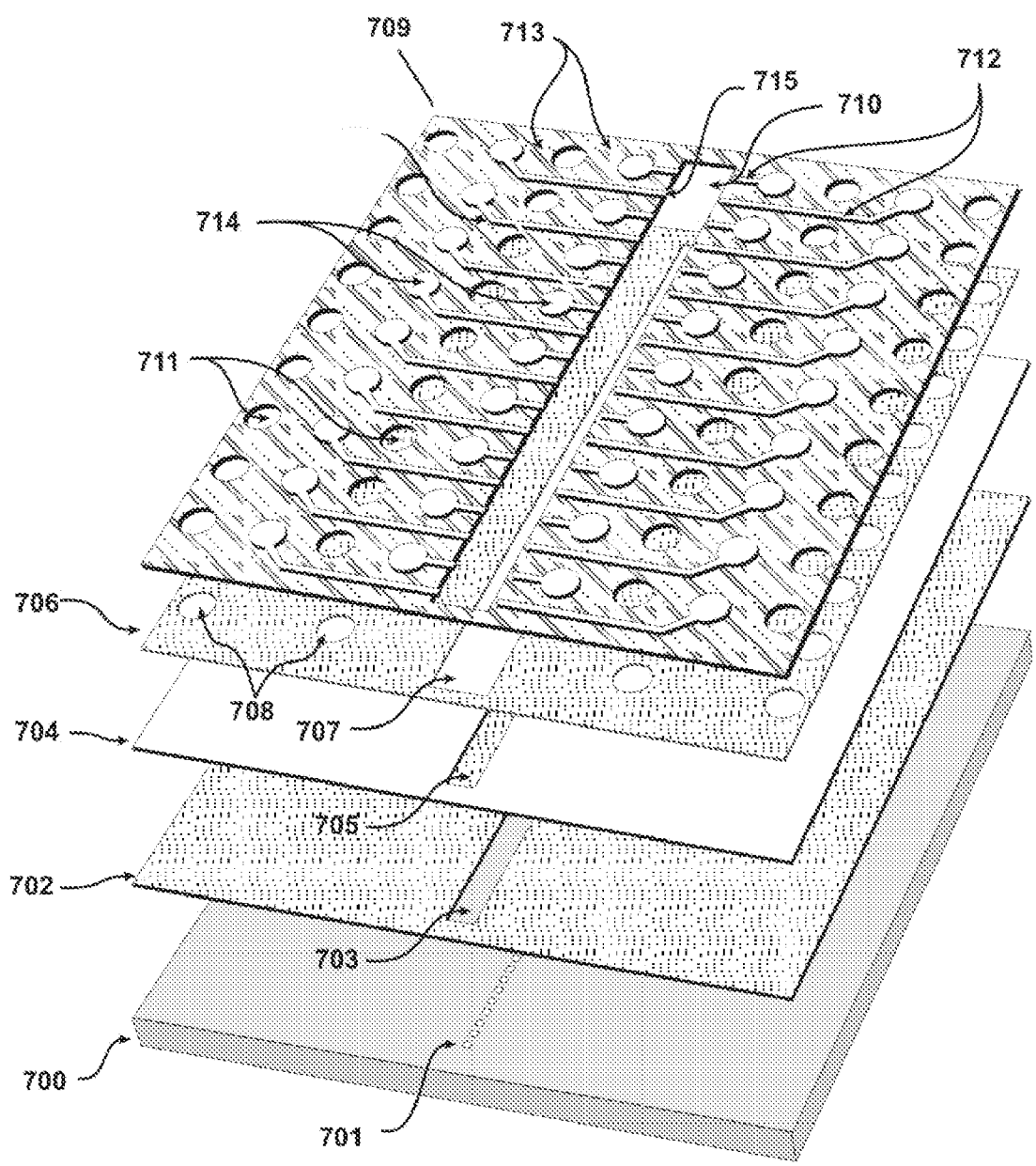
FIG. 7 shows a perspective view of the elements of construction of an embodiment of a memory IC package assembly.

FIG. 7 shows in a perspective exploded view the elements of a generalized embodiment the structures shown in FIG. 1 through FIG. 4 and FIG. 6. In the figure a memory IC die 700 having central terminals shown as wire bond pads 701 is disposed beneath a suitable adhesive layer 702 which has a central aperture 703 to expose wire bond pads 701 when assembled. A ground layer 704 of a suitable metal or other conductive material also has a central aperture 705 to expose the wire bond pads 701 when assembly of package elements to the die is complete. A second adhesive layer 706 is disposed above the ground layer 704 and has apertures 708 which serve to expose a plurality of ground contacts when assembled. A central aperture 707 is provided in adhesive layer 706 to allow access to the edge of the ground layer during wire bond assembly. An area proximate to the edge of the ground metal central aperture may be plated with a wire bondable metal (e.g., gold, silver, etc) to facilitate wire bonding (not shown).

A circuit layer 709 includes dielectric insulation 713 and circuits 712 formed on top of the dielectric insulation 713. Each circuit has a first end that has an interface region 714 for interconnection to a next level interconnection device (e.g. a PCB). Bond pads can be coupled to the interface regions to permit coupling to circuit paths such as wire, integral metal conductors, or other electrically conductive members. A second end 715 of each circuit 712 extends to the central aperture 710 to facilitate connection to a wire bond pad 701 of the memory die 700.

A central aperture 710 in the dielectric insulation layer 713, and is aligned with the aperture 707 adhesive layer 706, thereby allowing wire bonds to couple the circuits 712 to wire bond pads 701 on the memory IC die.

A plurality of apertures 711 in the circuit layer 709 are aligned with corresponding apertures in the adhesive layer 708. As can be better seen in conjunction with FIG. 8, these apertures 711 expose areas of the ground layer 704, thereby allowing bond wires or other conductive members to be coupled to the ground layer (directly, or indirectly through the addition of bond pads) through one or more of the apertures 711.

FIG. 8 shows in a perspective view of the elements shown in FIG. 7 in the form of a memory IC die package assembly 800. A memory IC die 700 has central terminals shown as wire bond pads 701 exposed through an alignment of apertures 703, 705, 707 and 710 described in FIG. 7, collectively forming central aperture 802 (FIG. 8). The aperture 710 of the circuit layer 709 is wider than the aperture 705 in the ground layer, thereby forming parallel shelves 804A and 804B, exposing a portion of the ground layer 704 in a stair step relationship to the conductive layer 709. Each of the shelves 804A, 804B is large enough to attach bond pads for electrical wire bond connections, and the central aperture 804 is large enough to allow bond wires to be coupled to the bond pads 701 on the memory IC die 700.

Figure 9:
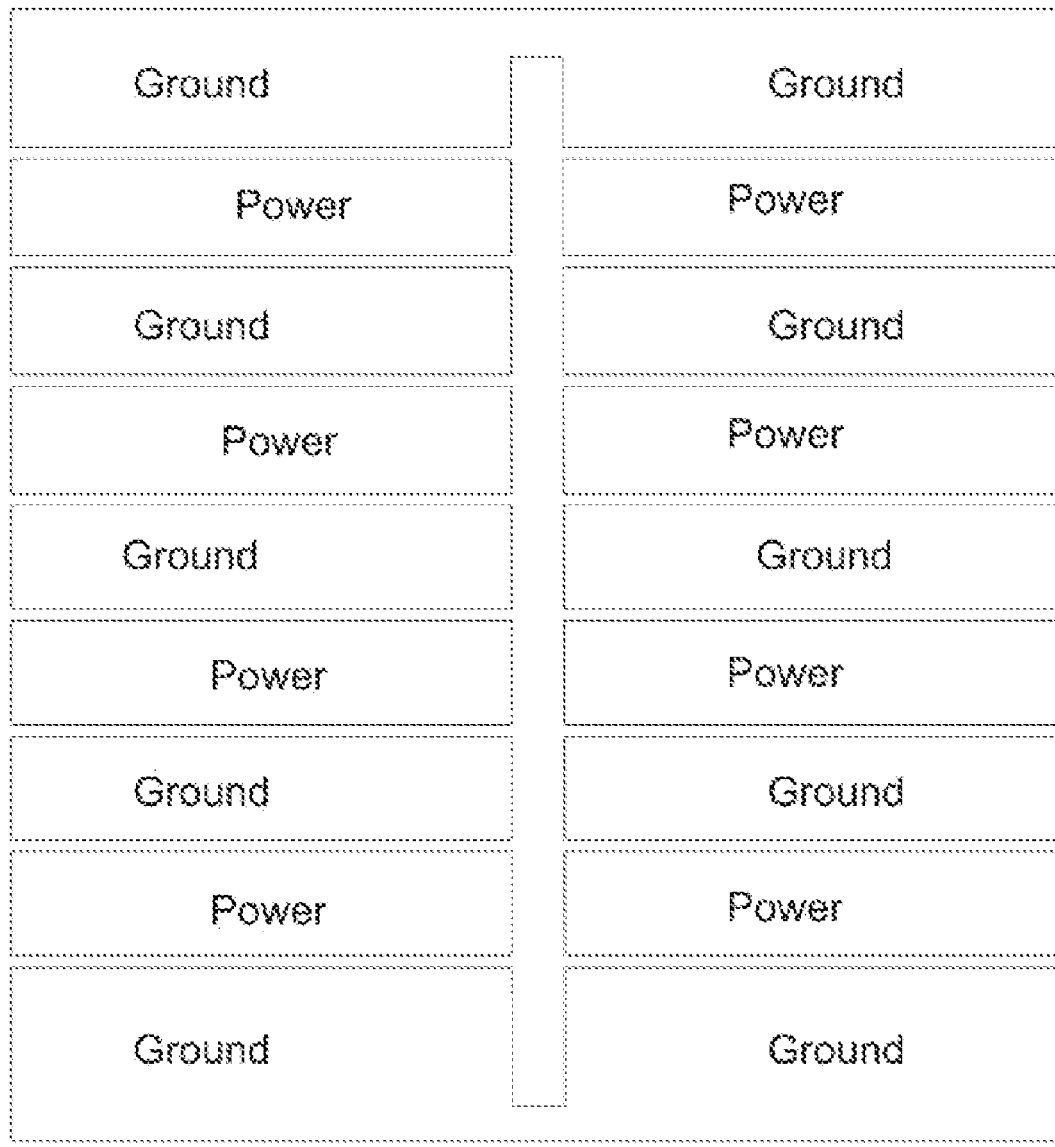
FIG. 9 shows a top view of a metal layer segmented into a plurality of regions for use as power and ground.

FIG. 9 shows an alternative embodiment of the metal layer where the metal layer is segmented to provide a plurality of ground and power features.

Restating here for emphasis, while the structures illustrated in this disclosure have shown with wire bonds being made to one central row of bond pads on the IC die, the structures are not so limited and could also be used for created using a multiple rows of bond pads in the center of the IC die or at the edges of the IC die or combinations thereof. Moreover, the ground layer circuit could be desirably produced directly on a wafer of memory (or other) circuits above an interposed layer of dielectric material having stress buffering capability and one or more stepped layers of metal circuits bonded to the top thereof providing both connection and additional stress buffering capability by means of a suitable adhesive.

Although the invention has been described briefly with reference to specific exemplary embodiments thereof, it will be evident that various modifications and changes may be made thereto without departing from the broader spirit and scope of the invention as set forth in the appended claims. For example, apertures disclosed can be created either before assembly using punching and drilling methods prior to lamination or after circuit package assembly using laser technology to ablate the apertures. Similarly, circuits could be built up by means of alternating layers of polymer and deposited metals to create finished structures which will be within the scope of this disclosure. Moreover, many specific details have been included herein which are not essential to make and use every embodiment of the invention. These details have been included to assist the reader in more easily understanding and comprehending the embodiments described herein. Accordingly, the specification and drawings of this disclosure should be regarded in an illustrative rather than a restrictive sense.

What is claimed:

1. A memory IC package assembly comprising:
   a memory die having bond pad terminations on a face thereof;
   a first metal layer having first and second surfaces, the first surface being bonded to the face of the die by a first adhesive layer, the first adhesive layer and the first metal layer configured to cover at least some of the die face and to expose the bond pad terminations; and,
   a first circuit layer comprising of a plurality of metal circuits disposed on a substrate, each of the plurality of metal circuits having a circuit trace coupling a first point of termination for interconnection to the die and a second point of termination for interconnection to a next level assembly, said first circuit layer being bonded to the second surface of the first metal layer using a second adhesive layer, wherein the first circuit layer and the second adhesive layer are configured to cover areas of the second surface of the first metal layer and to expose the bond pad terminations of the die and the substrate of the circuit layer and further having termination apertures aligned to expose select areas of the first metal layer.

2. The memory IC package assembly of claim 1 wherein an area of the first metal layer exposing the bond pad terminations comprises a first aperture, and wherein an area of the first circuit layer exposing the bond pad terminations comprises a second aperture.

3. The memory IC package assembly of claim 2 wherein the second aperture is aligned with, but wider than the first aperture, thereby exposing an inner periphery of the metal layer adjacent at least some of the memory die bond pads terminations.

4. The memory IC package assembly of claim 3 wherein a stress buffering capability provides adhesion between adjacent layers in a condition of unequal thermal expansion between the adjacent layers when mounted on a next level substrate.

5. The memory IC package assembly of claim 1 wherein the first metal layer which is segmented into power and ground regions.

6. The memory IC package assembly of claim 5 wherein at least one power region and at least one ground region are exposed areas on the inner periphery of the metal layer.

7. The memory IC package assembly of claim 1 where the finished assembly is a ball grid array.

8. The memory IC package assembly of claim 1 where the finished assembly is a land grid array.

9. The memory IC package assembly of claim 1 where the terminations of the metal layer protrude above the second surface of the metal layer.

10. The memory IC package assembly of claim 1 wherein at least a portion of the memory IC package assembly is produced by a layer lamination method.

11. The memory IC package assembly of claim 1 wherein at least a portion of the memory IC package assembly is produced by a build up method.

12. The memory IC package assembly of claim 1 wherein at least some of the circuit traces of the circuit layer are configured to operate at a specified impedance.

13. The memory IC package assembly of claim 1 wherein at least one of the first adhesive layer, the second adhesive layer, and the circuit layer substrate comprise a compliant stress buffering characteristic.

14. The memory IC package assembly of claim 13 wherein the stress buffering characteristic includes a buffering characteristic to maintain adhesion between layers having different thermal coefficients of expansion in use.

15. The memory IC package assembly of claim 1 wherein the bond pad terminations are arranged in a linear array.

16. The memory IC package assembly of claim 15 wherein the linear array comprises at least two parallel rows of bond pad terminations.

17. A memory IC package assembly comprising:
a memory die having bond pad terminations on a face thereof, a first metal layer built up on the face of the die and covering the die face and leaving exposed the bond pad terminations and at least one circuit layer comprised of a plurality of metal circuits having first points of termination for interconnection to the die and second points of termination for interconnection to a next level assembly, said circuit layer being bonded to the first metal layer using a suitable adhesive and covering the first metal layer and leaving exposed areas of the first metal layer so that they can be connected to the die and said circuit layer having apertures which expose the first metal layer defining the points of termination for interconnection to the next level assembly and at least one other aperture leaving exposed areas of the first metal layer for interconnection to the bond pads on the die and said next level assembly joined to the die having a metal coating, using a suitable stress buffering adhesive.

18. A memory IC package assembly comprising: a memory die having bond pad terminations on a face thereof, a first metal layer bonded to the face of the die and covering the die face and leaving exposed the bond pad terminations and at least one circuit layer comprised of a plurality of metal circuits having first points of termination for interconnection to the die and second points of termination for interconnection to a next level assembly, said circuit layer being bonded to the first metal layer and covering the first metal layer and leaving exposed areas of the first metal layer so that they can be connected to the die and said circuit layer having apertures which expose the first metal layer defining the points of termination for interconnection to the next level assembly and at least one other aperture leaving exposed areas of the first metal layer for interconnection to the bond pads on the die.

19. The memory IC package assembly of claim 18 wherein the first metal layer is segmented into power and ground regions.

20. The memory IC package assembly of claim 18 where the assembly comprises a ball grid array.

* * * * *